US012761676B2

(12) United States Patent
Chen et al.

(10) Patent No.: US 12,761,676 B2
(45) Date of Patent: Oct. 13, 2026

(54) ERASABLE PROGRAMMABLE NON-VOLATILE MEMORY CELL

(71) Applicant: eMemory Technology Inc., Hsin-Chu (TW)

(72) Inventors: Hsueh-Wei Chen, Hsinchu County (TW); Cheng-Yu Chung, Hsinchu County (TW); Woan-Yun Hsiao, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 105 days.

(21) Appl. No.: 19/049,008

(22) Filed: Feb. 10, 2025

(65) Prior Publication Data

US 2025/0267863 A1 Aug. 21, 2025

Related U.S. Application Data

(60) Provisional application No. 63/554,164, filed on Feb. 16, 2024.

(51) Int. Cl.
*H10B 41/70* (2023.01)
*G05F 1/56* (2006.01)
(Continued)

(52) U.S. Cl.
CPC .............. *G05F 1/56* (2013.01); *G11C 16/045* (2013.01); *G11C 16/10* (2013.01); *G11C 16/14* (2013.01);
(Continued)

(58) Field of Classification Search
CPC .................................. H10B 41/70; G05F 1/56
(Continued)

(56) References Cited

U.S. PATENT DOCUMENTS 4,051,389 A * 9/1977 Kaneko .................. H10B 10/10
327/578
4,550,390 A * 10/1985 Akashi ................ G11C 11/4116
365/228
(Continued)

FOREIGN PATENT DOCUMENTS

| | | | |
|---|---|---|---|
| TW | 201721646 | A | 6/2017 |
| TW | 201837907 | A | 10/2018 |
| TW | 202001912 | A | 1/2020 |

OTHER PUBLICATIONS

Office Action issued by Taiwan Intellectual Property Office on Nov. 12, 2025.

*Primary Examiner* — Muna A Techane
(74) *Attorney, Agent, or Firm* — WPAT, PC

(57) ABSTRACT

An erasable programmable non-volatile memory cell includes an isolation structure, a first P-well region, a second P-well region, an N-type isolation region, a first gate structure, a second gate structure, a first merged doped region, a second merged doped region, a third merged doped region and a fourth merged doped region. The isolation structure is formed on a P-type semiconductor substrate. The first gate structure and the second gate structure are formed on the surface of the P-type semiconductor substrate corresponding to the first region. An area the P-type semiconductor substrate corresponding to the first region are divided into a first merged doped region, a second merged doped region and a third merged doped region. The fourth merged doped region is formed in the P-type semiconductor substrate corresponding to the second region.

18 Claims, 5 Drawing Sheets

(51) Int. Cl.

| | |
|---|---|
| ***G11C 16/04*** | (2006.01) |
| ***G11C 16/10*** | (2006.01) |
| ***G11C 16/14*** | (2006.01) |
| ***G11C 16/26*** | (2006.01) |
| ***H10B 41/35*** | (2023.01) |

(52) U.S. Cl.
CPC ............. *G11C 16/26* (2013.01); *H10B 41/35* (2023.02); *H10B 41/70* (2023.02)

(58) Field of Classification Search
USPC ........................................................ 365/185.1
See application file for complete search history.

(56) References Cited

U.S. PATENT DOCUMENTS

| | | | | |
|---|---|---|---|---|
| 6,288,943 | B1 | 9/2001 | Chi | |
| 7,948,020 | B2 | 5/2011 | Roizin et al. | |
| 9,805,806 | B2 * | 10/2017 | Chen .................. | G11C 16/0433 |
| 2008/0035973 | A1 * | 2/2008 | Lin ........................ | H10B 41/60<br>257/E27.103 |

* cited by examiner

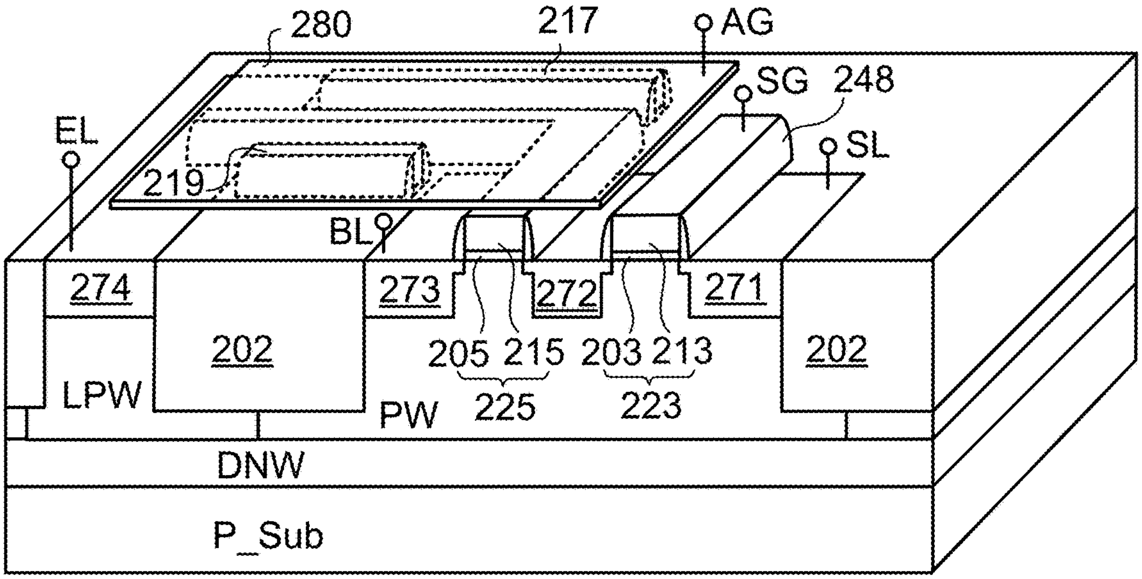
FIG. 1G
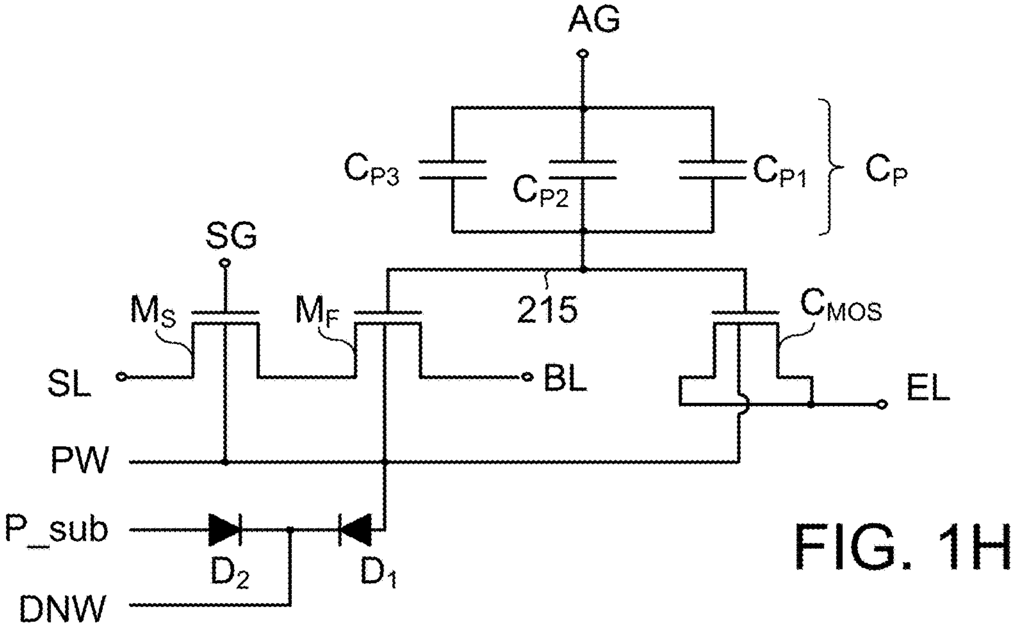
FIG. 1H
| | SL | SG | BL | EL | AG | PW | Time |
|---|---|---|---|---|---|---|---|
| PGM | 0V | $V_{PP1}$ | $V_{PP1}$ | $V_{PP1}$ | $V_{PP1}$ | $V_{BB1}$ | 50μs |
| ERS | $V_{BB2}$ | $V_{BB2}$ | $V_{BB2}$ | $V_{EE1}$ | $V_{BB2}$ | $V_{BB2}$ | 100ms |
| Read | $V_R$ | $V_{PP1}$ | 0V | $V_{PP1}$ | $V_{PP1}$ | $V_{BB3}$ | |
FIG. 2A

| | SL | SG | BL | EL | AG | PW | Time |
|---|---|---|---|---|---|---|---|
| PGM | $\|V_{BB1}\|$ | $V_{PPa}$ | $V_{PPa}$ | $V_{PPa}$ | $V_{PPa}$ | 0V | 50μs |
| ERS | $V_{BBa}$ | $V_{BBa}$ | $V_{BBa}$ | $V_{EEa}$ | $V_{BBa}$ | $V_{BBa}$ | 100ms |
| Read | $V_R$ | $V_{PPb}$ | 0V | $V_{PPb}$ | $V_{PPb}$ | $V_{BBb}$ | |

FIG. 3

ERASABLE PROGRAMMABLE NON-VOLATILE MEMORY CELL

This application claims the benefit of US provisional application Ser. No. 63/554,164, filed Feb. 16, 2024, the subject matters of which is incorporated herein by reference.

FIELD OF THE INVENTION

The present invention relates to a non-volatile memory, and more particularly to an erasable programmable non-volatile memory cell.

BACKGROUND OF THE INVENTION

As is well known, an erasable programmable non-volatile memory includes a control circuit and an array structure. The array structure is composed of a plurality of erasable programmable non-volatile memory cells. Each erasable programmable non-volatile memory cell includes a storage unit. For example, the storage unit is a floating gate transistor. The storage state of the erasable programmable non-volatile memory cell is determined according to the number of charges stored in the floating gate of the floating gate transistor. For brevity, the erasable programmable non-volatile memory cell is referred hereafter as a memory cell.

Furthermore, a control circuit in the erasable programmable non-volatile memory can selectively perform a program action or an erase action on any memory cell in the array structure. For example, when a program action is performed, a program voltage is provided to the memory cell. Consequently, carriers (e.g., electrons) are injected into the floating gate of the floating gate transistor. Under this circumstance, the memory cell is in a programmed state. When an erase action is performed, an erase voltage is provided to the memory cell. Consequently, carriers (e.g., electrons) are ejected from the floating gate of the floating gate transistor. Under this circumstance, the memory cell is in an erase state. Each of the erase voltage and the program voltage is greater than a supply voltage provided to the erasable programmable non-volatile memory. For example, the supply voltage is 3.3 V, the erase voltage is 15 V, and the program voltage is 8V. The erase voltage is greater than the program voltage. The program voltage is greater than the supply voltage.

Generally, the control circuit in the non-volatile memory is a logic circuit. The ground voltage (0 V) is the lowest voltage received by the control circuit. The supply voltage is the highest voltage received by the control circuit. That is, the logic high level of the control circuit is the supply voltage, and the logic low level of the control circuit is the ground voltage (0 V).

The memory cells in the array structure do not belong to the logic circuit. For example, when the program action is performed, the lowest voltage received by the array structure is the ground voltage (0 V), and the highest voltage received by the array structure is the program voltage. In addition, when the erase action is performed, the lowest voltage received by the array structure is the ground voltage (0 V), and the highest voltage received by the array structure is the erase voltage.

In order to provide a higher erase voltage and a higher program voltage, the non-volatile memory is further equipped with a charge pump to boost the supply voltage to the erase voltage and the program voltage. However, the charge pump for outputting the higher voltage (e.g., the erase voltage) occupies a larger layout area of the non-volatile memory. In addition, the electronic components in the charge pump need to withstand the voltage stress of the erase voltage (e.g., 15 V).

SUMMARY OF THE INVENTION

An embodiment of the present invention provides an erasable programmable non-volatile memory cell. The erasable programmable non-volatile memory cell comprises: an isolation structure formed on a P-type semiconductor substrate, wherein a surface of the P-type semiconductor substrate is divided into a first region and a second region by the isolation structure; a first P-well region formed in the P-type semiconductor substrate and corresponding to the first region; a second P-well region formed in the P-type semiconductor substrate and corresponding to the second region, wherein the first P-well region and the second P-well region are in contact with each other; an N-type isolation region, wherein the N-type isolation region is arranged between the first P-well region and the P-type semiconductor substrate to isolate the first P-well region from the P-type semiconductor substrate, the N-type isolation region is arranged between the second P-well region and the P-type semiconductor substrate to isolate the second P-well region from the P-type semiconductor substrate; a first gate structure and a second gate structure formed on the first region, wherein the first region is divided into a first merged doped region, a second merged doped region and a third merged doped region by the first gate structure and the second gate structure; and, a fourth merged doped region formed in the P-type semiconductor substrate and corresponding to the second region, and located beside the second gate structure, wherein the second gate structure is externally extended to the second region through a surface of the isolation structure, and a portion of the second region is covered by the second gate structure, wherein the first merged doped region, the first gate structure and the second merged doped region are collaboratively formed as a select transistor, the second merged doped region, the second gate structure and the third merged doped region are collaboratively formed as a floating gate transistor, and the second gate structure and the fourth merged doped region are collaboratively formed as a MOS capacitor, wherein when an program action is performed, the a voltage of the first P-well region is lower than a voltage of the first merged doped region and a voltage of the third merged doped region.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 1A to 1G schematically illustrate the steps of a method of manufacturing a memory cell according to an embodiment of the present invention;

FIG. 1H is a schematic equivalent circuit diagram of the memory cell according to the embodiment of the present invention;

FIG. 2A is a first exemplary bias voltage table illustrating the bias voltages for performing a program action, an erase action and a read action on the memory cell of the present invention;

FIG. 3 is a second exemplary bias voltage table illustrating the bias voltages for performing a program action, an erase action and a read action on the memory cell of the present invention.

DETAILED DESCRIPTION OF PREFERRED EMBODIMENTS

The present invention provides an erasable programmable non-volatile memory cell with a novel structure. An isolation area is formed in a semiconductor substrate. The memory cell is constructed in the isolation area. A control circuit is located outside the isolation area. In an embodiment, the memory cell in the isolation area can receive a negative voltage. When the memory cell undergoes a program action, an erase action or a read action, the operations of the control circuit outside the isolation area will not be adversely affected.

FIGS. 1A to 1G schematically illustrate the steps of a method of manufacturing a memory cell according to an embodiment of the present invention. FIG. 1H is a schematic equivalent circuit diagram of the memory cell of the present invention.

Figure 1A:
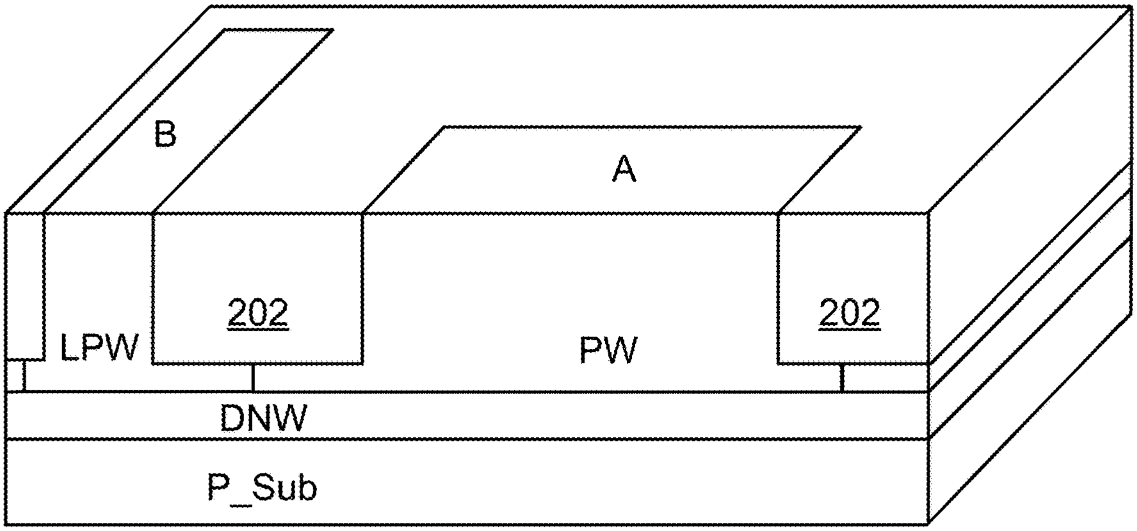

As shown in FIG. 1A, an isolation structure forming step is performed. An isolation structure 202 is formed on a P-type semiconductor substrate P_sub. The P-type semiconductor substrate P_sub is covered by the isolation structure 202, and the surface of the P-type semiconductor substrate P_sub is exposed and divided into a region A and a region B by the isolation structure 202. For example, the isolation structure 202 is a shallow trench isolation stricture, which is also referred as an STI structure.

Then, a well region forming step is performed. A first well region (e.g., a P-well region PW) is formed in the P-type semiconductor substrate P_sub and corresponding to the region A. In addition, a second well region is formed in the P-type semiconductor substrate P_sub and corresponding to the region B. For example, the second well region is a lightly doped P-well region LPW or part of the P-well region PW. The first well region and the second well region are electrically connected with each other. For example, the P-well region PW and the lightly doped P-well region LPW are contacted with each other. Furthermore, an N-type isolation region (e.g., a deep N-well region DNW) is formed to isolate the first well region and the second well region from the P-type semiconductor substrate P_sub.

It is noted that numerous modifications and alterations may be made while retaining the teachings of the invention. For example, in another embodiment, an N-type buried layer NBL is served as the N-type isolation region. In yet another embodiment, the first well region and the second well region have the same doping concentration and together form the P-well region.

As shown in FIG. 1A, the deep N-well region DNW (i.e., the N-type isolation region) is arranged between the P-well region PW and the P-type semiconductor substrate P_sub. Consequently, the P-well region PW and the P-type semiconductor substrate P_sub are not in direct contact with each other. Similarly, the deep N-well region DNW (i.e., the N-type isolation region) is arranged between the lightly doped P-well region LPW and the P-type semiconductor substrate P_sub. Consequently, the lightly doped P-well region LPW and the P-type semiconductor substrate P_sub are not in direct contact with each other.

Figure 1B:
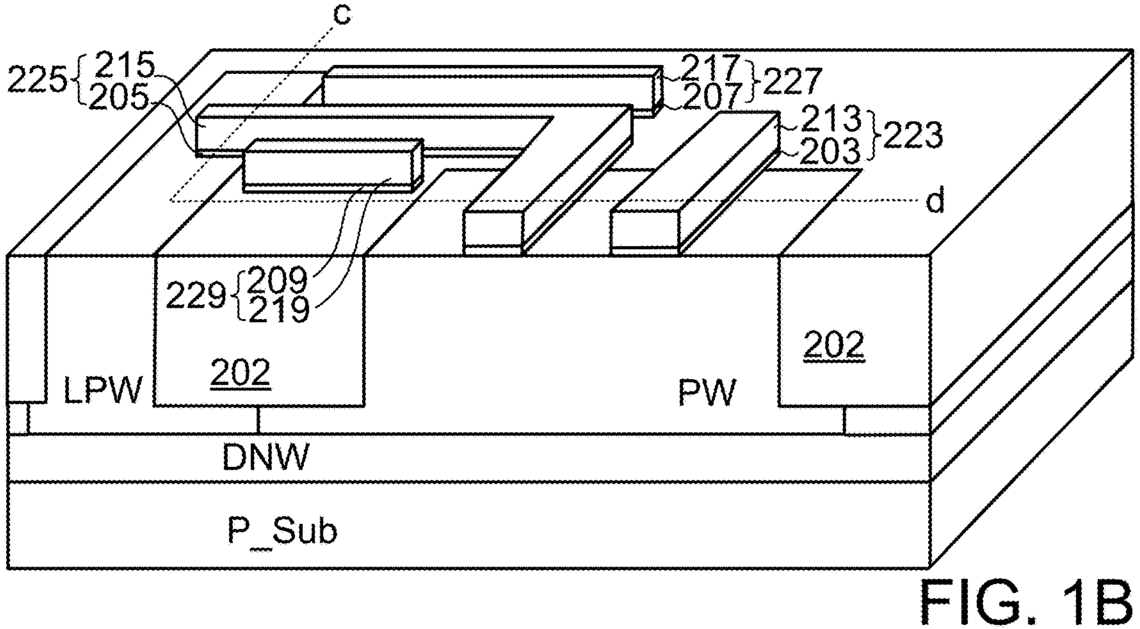

Then, a gate structure forming step is performed. As shown in FIG. 1B, four gate structures 223, 225, 227 and 229 are formed on the surface of the P-type semiconductor substrate P_sub. The gate structure 223 includes a gate dielectric layer 203 and a polysilicon gate layer 213. The gate structure 225 includes a gate dielectric layer 205 and a polysilicon gate layer 215. The gate structure 227 includes a gate dielectric layer 207 and a polysilicon gate layer 217. The gate structure 229 includes a gate dielectric layer 209 and a polysilicon gate layer 219. The polysilicon gate layer 213 is located over the gate dielectric layer 203. The polysilicon gate layer 215 is located over the gate dielectric layer 205. The polysilicon gate layer 217 is located over the gate dielectric layer 207. The polysilicon gate layer 219 is located over the gate dielectric layer 209.

The two gate structures 223 and 225 are formed on the surface of the region A. In addition, the region A is divided into three sub-regions by the two gate structures 223 and 225. The gate structure 225 is L-shaped. A longitudinal part of the gate structure 225 is extended from the surface of the region A to the surface of the isolation structure 202. A lateral (extension) part of the gate structure 225 is externally extended to the region B through the surface of the isolation structure 202, and therefore a portion of the region B is covered by the gate structure 225. The two gate structures 227 and 229 are disposed on the surface of the isolation structure 202 and cover the isolation structure 202 only, that is, the gate structures 227 and 229 do not cover the region A and the region B. In addition, the two gate structures 227 and 229 are respectively located beside two opposite lateral sides of the lateral part of the gate structure 225. The polysilicon gate layer 215 of the gate structure 225 is served as a floating gate of a floating gate transistor. The polysilicon gate layer 213 of the gate structure 223 is served as a select gate of a select transistor.

Figure 1C:
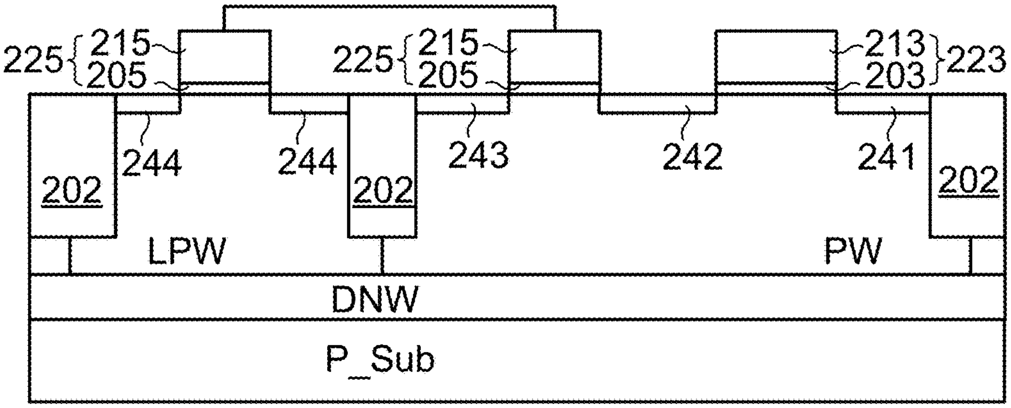

Then, a doping process is performed. FIG. 1C is a schematic cross-sectional view illustrating the resulting structure shown in FIG. 1B and taken along the dashed line c-d. Firstly, a lightly doped drain process (LDD process) is performed with the gate structures 223 and 225 serving as the masks. Consequently, three n-type lightly doped drain regions (n-LDD regions) 241, 242 and 243 are formed in the P-type semiconductor substrate P_sub and corresponding to the region A, and an n-type lightly doped drain region (n-LDD region) 244 is formed in the P-type semiconductor substrate P_sub and corresponding to the region B. The n-LDD region 241 is formed under the surface of the P-type semiconductor substrate P_sub and corresponding to the region A, and is located beside a first side of the gate structure 223. The n-LDD region 242 is formed under the surface of the P-type semiconductor substrate P_sub and corresponding to the region A, and is arranged between a second side of the gate structure 223 and a first side of the gate structure 225. The n-LDD region 243 is formed under the surface of the P-type semiconductor substrate P_sub and corresponding to the region A, and is located beside a second side of the gate structure 225. The n-LDD region 244 is formed under the surface of the P-type semiconductor substrate P_sub and corresponding to the region B, and is located beside the lateral part of the gate structure 225. Specifically, sides of the lateral part that are in the region B are adjacent to the n-LDD region 244.

In some embodiments, several lightly doped drain processes (LDD process) may be performed. For example, the n-LDD regions located beside two sides of the gate structure 223 are formed by a medium-voltage lightly doped drain process (MV LDD process). The n-LDD regions located beside two sides of the gate structure 225 are formed by a low-voltage lightly doped drain process (LV LDD process). That is to say, the doping concentration of the n-LDD regions located beside two sides of the gate structure 223 is less than the doping concentration of the n-LDD regions located beside two sides of the gate structure 225. The doping depth of the n-LDD regions located beside two sides of the gate structure 223 is deeper than the doping depth of the n-LDD regions located beside two sides of the gate structure 225.

Figure 1D:
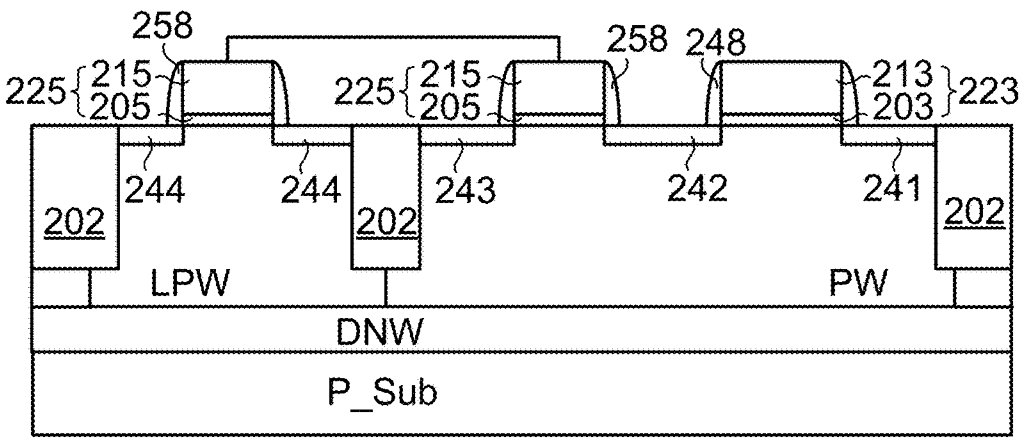

Please refer to FIG. 1D. Then, a spacer 248 is formed on the sidewalls of the gate structure 223, and a spacer 258 is formed on the sidewalls of the gate structure 225. Similarly, spacers (not shown) are formed on the sidewalls of the gate structures 227 and 229.

Figure 1E:
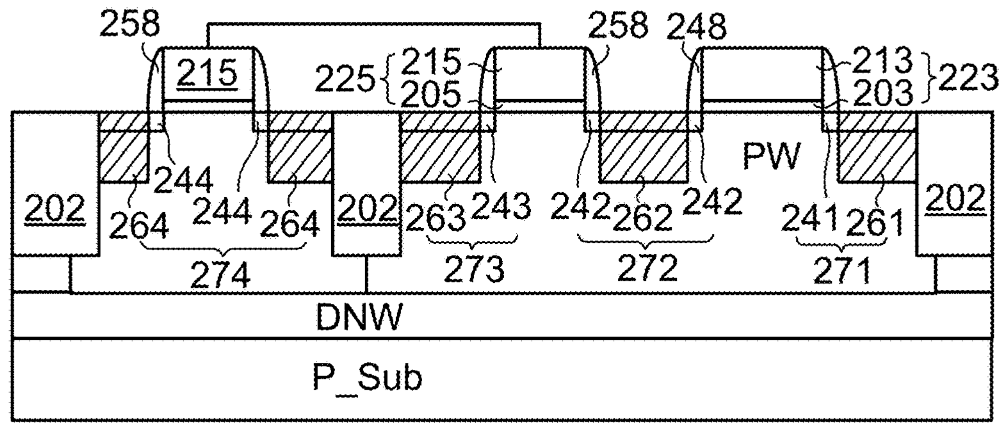

Please refer to FIG. 1E. Then, an n-type ion implantation process is performed on the surface of the P-type semiconductor substrate P_sub by using the two gate structures 223 and 225 and the two spacers 248 and 258 as masks. Consequently, three n-type ion implantation regions 261, 262 and 263 indicated by oblique lines are formed on three sub-regions of the region A uncovered by the two gate structures 223 and 225 and the two spacers 248 and 258, and an n-type ion implantation region 264 shown in oblique lines is formed on the region B uncovered by the gate structure 225 and the spacer 258. Especially, the n-type ion implantation regions 261, 262, 263, and 264 have the highest doping concentration, and their dopant concentration is greater than the dopant concentration of the n-LDD regions 241, 242, 243, and 244.

Figure 1F:
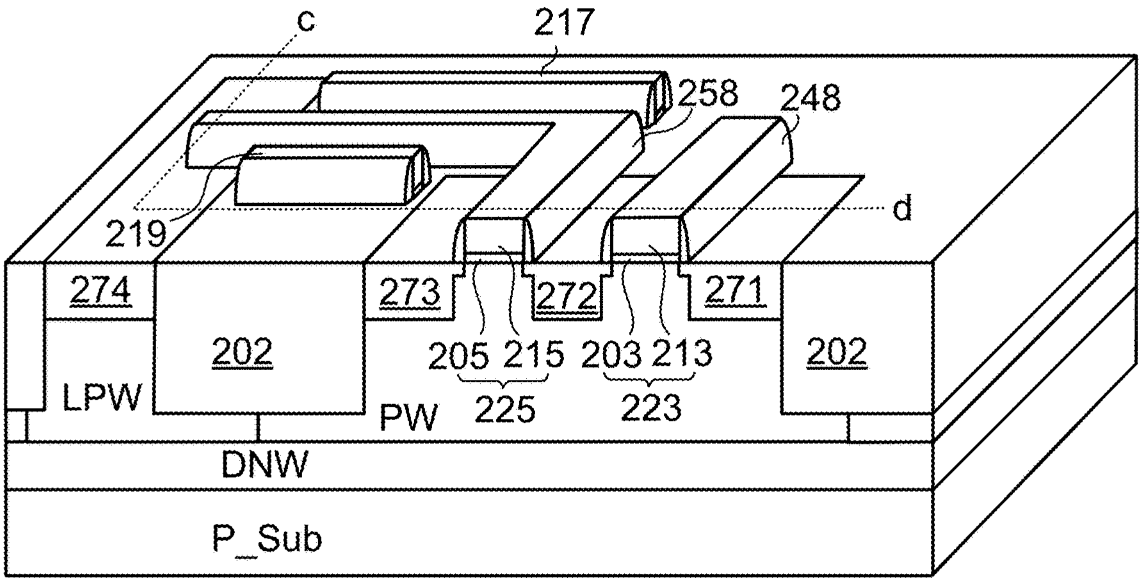

Please refer to FIG. 1E again. The n-LDD region 241 and the n-type ion implantation regions 261 are collaboratively formed as a merged n-doped region 271. The merged n-doped region 271 is formed in the P-type semiconductor substrate P_sub and corresponding to the region A, and is located beside the first side of the gate structure 223. The n-LDD region 242 and the n-type ion implantation regions 262 are collaboratively formed as a merged n-doped region 272. The merged n-doped region 272 is formed in the P-type semiconductor substrate P_sub and corresponding to the region A, and is arranged between the second side of the gate structure 223 and the first side of the gate structure 225. The n-LDD region 243 and the n-type ion implantation regions 263 are collaboratively formed as a merged n-doped region 273. The merged n-doped region 273 is formed in the P-type semiconductor substrate P_sub and corresponding to the region A, and is located beside the second side of the gate structure 225. The n-LDD region 244 and the n-type ion implantation region 264 are collaboratively formed as a merged n-doped region 274. The merged n-doped region 274 is formed in the P-type semiconductor substrate P_sub and corresponding to the region B, and is located beside the lateral part of the gate structure 225. The perspective view of the structure of FIG. 1E is shown in FIG. 1F.

In the region A, the gate structure 223 and the merged n-doped regions 271 and 272 on its two sides are collaboratively formed as a select transistor. In addition, the gate structure 225 and the two merged n-doped regions 272 and 273 on its two sides are collaboratively formed as a floating gate transistor. That is, the region A is divided into the merged n-doped regions 271, 272, and 273 by the gate structures 223 and 225. In this embodiment, the floating gate transistor and the select transistor are n-type transistors constructed in the P-well region PW. That is, the body terminal of the floating gate transistor and the body terminal of the select transistor are connected with the P-well region PW.

The merged n-doped region 274 and the gate structure 225 are collaboratively formed as an n-type transistor. The body terminal of the n-type transistor is connected with the lightly doped P-well region LPW, and the two drain/source terminals of the n-type transistor are connected with each other through the merged n-doped region 274. Consequently, the n-type transistor is connected as a MOS capacitor. In one embodiment, the lateral part of the gate structure 225 extends across the region B. Therefore, the region B is divided into two merged n-doped regions by the gate structure 225, where the two merged n-doped regions are electrically connected to form the MOS capacitor. In other words, the two merged n-doped regions are respectively beside the two sides of the lateral part of the gate structure 225.

Please refer to FIG. 1G. Then, a metal layer 280 is formed over the polysilicon gate layers 215, 217, and 219. The metal layer 280 is electrically connected with the two polysilicon gate layers 217 and 219. However, the metal layer 280 is not electrically connected with the two polysilicon gate layers 213 and 215. After a step of forming metal conductor lines is completed, the memory cell of the first embodiment is fabricated. That is, the merged n-doped region 271 is connected with a source line SL, the merged n-doped region 273 is connected with a bit line BL, the merged n-doped region 274 is connected with an erase line EL, the polysilicon gate layer 213 is connected with a select gate line SG, and the metal layer 280 is connected with an assist gate line AG.

In the memory cell of this embodiment, the gate structures 227 and 229 are disposed on the surface of the isolation structure 202 and besides the polysilicon gate structure 225. In addition, the metal layer 280 is located over and isolated from the polysilicon gate structure 225. Consequently, the polysilicon gate layer 215 and the polysilicon gate layer 217 are collaboratively formed as a first poly/poly plate capacitor, and the polysilicon gate layer 215 and the polysilicon gate layer 219 are collaboratively formed as a second poly/poly plate capacitor. In addition, the polysilicon gate layer 215 and the metal layer 280 are collaboratively formed as a metal/poly plate capacitor.

As shown in FIG. 1H, the memory cell includes a select transistor $M_S$, a floating gate transistor $M_F$, a MOS capacitor $C_{MOS}$, a first poly/poly plate capacitor $C_{P1}$, a metal/poly plate capacitor $C_{P2}$ and a second poly/poly plate capacitor $C_{P3}$. The first poly/poly plate capacitor $C_{P1}$, the metal/poly plate capacitor $C_{P2}$ and the second poly/poly plate capacitor $C_{P3}$ are connected with each other in parallel. The three plate capacitors $C_{P1}$, $C_{P2}$ and $C_{P3}$ in parallel connection can be equivalent to a plate capacitor $C_P$. The first terminal of the plate capacitor $C_P$ is connected with the floating gate (e.g., the polysilicon gate layer 215) of the floating gate transistor $M_F$, and the second terminal of the plate capacitor $C_P$ is connected with the assist gate line AG. It is noted that plate capacitor $C_P$ of the memory cell is not restricted to three parallel-connected plate capacitors $C_{P1}$, $C_{P2}$ and $C_{P3}$. That is, at least one capacitor is feasible. In a variant example, the plate capacitors $C_{P1}$ and $C_{P2}$ are omitted, and therefore a single capacitor is connected between the polysilicon gate layer 215 and the assist gate line AG. In another variant example, one of the plate capacitors $C_{P1}$ and $C_{P2}$ is omitted, and therefore two capacitors are connected between the polysilicon gate layer 215 and the assist gate line AG in parallel. In some other embodiments, the plate capacitor $C_P$ and the assist gate line AG are omitted.

The gate terminal of the select transistor $M_S$ is connected with the select gate line SG. The first drain/source terminal of the select transistor $M_S$ is connected with the source line SL. The first drain/source terminal of the floating gate transistor $M_F$ is connected with the second drain/source terminal of the select transistor $M_S$. The second drain/source terminal of the floating gate transistor $M_F$ is connected with the bit line BL.

The body terminal of the select transistor $M_S$ and the body terminal of the floating gate transistor $M_F$ are connected with the P-well region PW. The P-well region PW and the deep N-well region DNW (i.e., the N-type isolation region) are collaboratively formed as a first diode $D_1$. The P-type semiconductor substrate P_sub and the deep N-well region DNW are collaboratively formed as a second diode $D_2$. The anode of the first diode $D_1$ is connected with the P-well region PW. The cathode of the first diode $D_1$ is connected with the deep N-well region DNW. The anode of the second diode $D_2$ is connected with the P-type semiconductor substrate P_sub. The cathode of the second diode $D_2$ is connected with the deep N-well region DNW.

The first terminal of the MOS capacitor $C_{MOS}$ is connected with the floating gate (e.g., the polysilicon gate layer 215). The second terminal of the MOS capacitor $C_{MOS}$ is connected with the erase line EL. The first terminal of the first poly/poly plate capacitor $C_{P1}$ is connected with the floating gate (e.g., the polysilicon gate layer 215). The second terminal of the first poly/poly plate capacitor $C_{P1}$ is connected with the assist gate line AG. The first terminal of the metal/poly plate capacitor $C_{P2}$ is connected with the floating gate (e.g., the polysilicon gate layer 215). The second terminal of the metal/poly plate capacitor $C_{P2}$ is connected with the assist gate line AG. The first terminal of the second poly/poly plate capacitor $C_{P3}$ is connected with the floating gate (e.g., the polysilicon gate layer 215). The second terminal of the second poly/poly plate capacitor $C_{P3}$ is connected with the assist gate line AG. That is, the first terminal of the plate capacitor $C_P$ is connected with the floating gate (e.g., the polysilicon gate layer 215), and the second terminal of the plate capacitor $C_P$ is connected with the assist gate line AG.

Figure 2B:
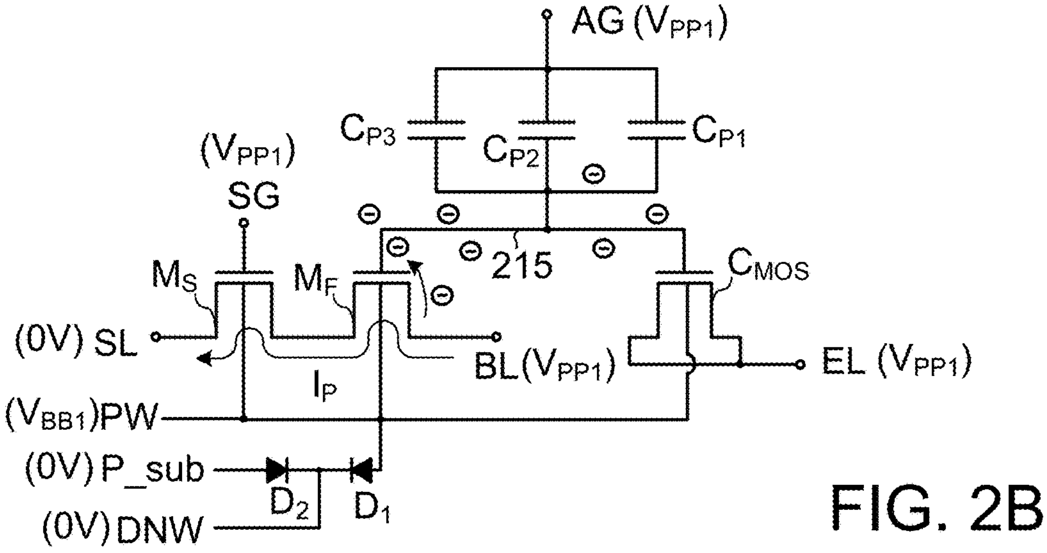
FIG. 2B is a schematic circuit diagram illustrating the program action performed on the memory cell of the present invention.
Figure 2C:
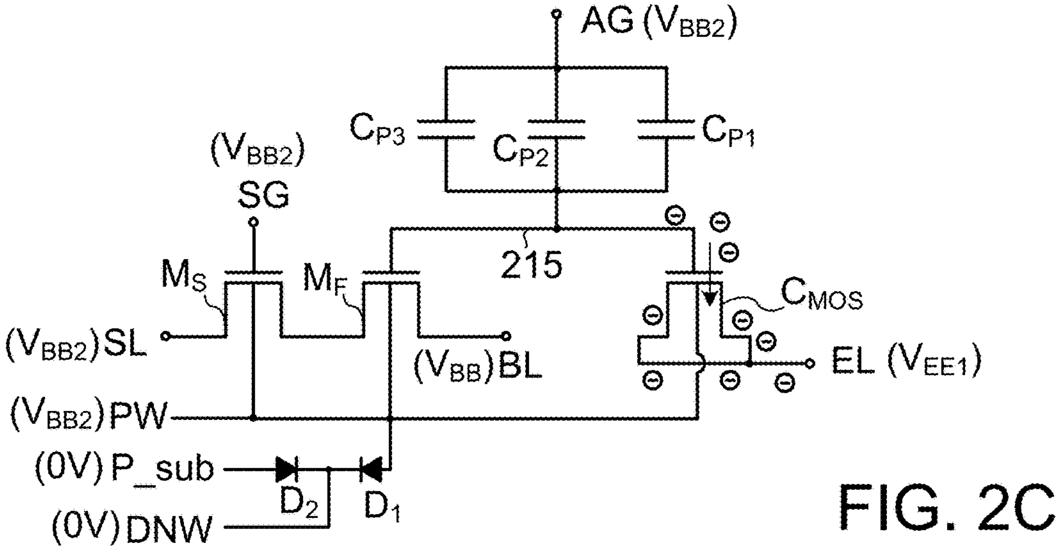
FIG. 2C is a schematic circuit diagram illustrating the erase action performed on the memory cell of the present invention.
Figure 2D:
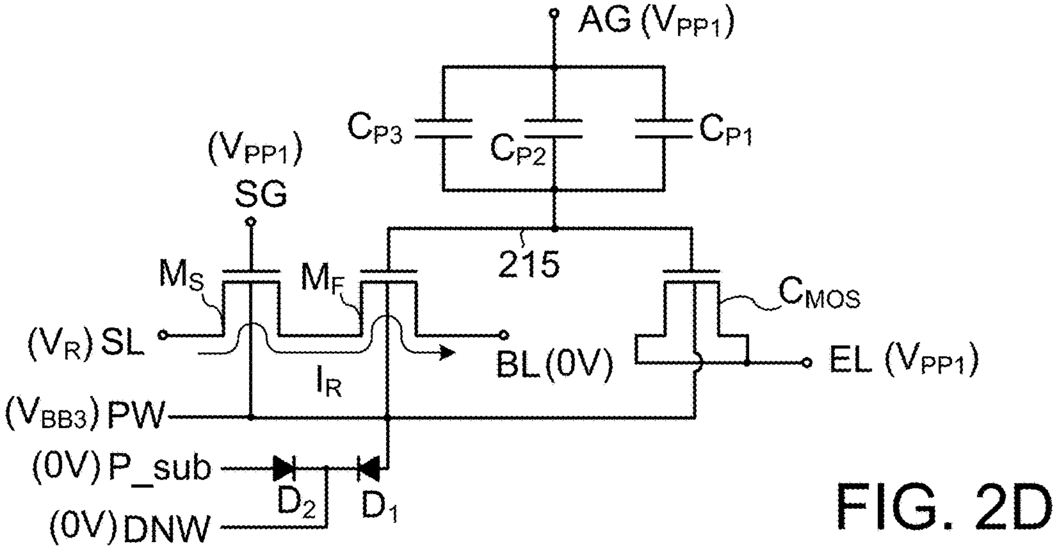
FIG. 2D is a schematic circuit diagram illustrating the read action performed on the memory cell of the present invention.

FIG. 2A is a first exemplary bias voltage table illustrating the bias voltages for performing a program action, an erase action and a read action on the memory cell of the present invention. FIG. 2B is a schematic circuit diagram illustrating the program action performed on the memory cell of the present invention. FIG. 2C is a schematic circuit diagram illustrating the erase action performed on the memory cell of the present invention. FIG. 2D is a schematic circuit diagram illustrating the read action performed on the memory cell of the present invention.

When the program action (PGM), the erase action (ERS) and the read action (Read) are performed, the P-well region PW and the source line SL may receive different negative voltages. The erase voltage $V_{EE1}$ is greater than or equal to the program voltage $V_{PP1}$, the program voltage $V_{PP1}$ is greater than the read voltage $V_R$, and the read voltage $V_R$ is greater than the ground voltage (0 V). For example, the erase voltage $V_{EE1}$ is 10 V, the program voltage $V_{PP1}$ is 6 V, and the read voltage $V_R$ is 1.8 V.

Furthermore, when the program action (PGM), the erase action (ERS) or the read action (Read) is performed, the two diodes $D_1$ and $D_2$ are reverse biased. That is, the junction between the P-well region PW and the deep N-well region DNW is reverse biased, and the junction between the P-type semiconductor substrate P_sub and the deep N-well region DNW is also reverse biased. For example, when performing the program action, the erase action, and the read action, the voltage of the deep N-well region DNW is higher than or equal to the voltages of the P-well region PW, the lightly doped P-well region LPW, and the P-type semiconductor substrate P_sub.

Please refer to FIG. 2B. When the program action is performed, the source line SL receives the ground voltage (0 V), the select gate line SG receives the program voltage $V_{PP1}$, the bit line BL receives the program voltage $V_{PP1}$, the erase line EL receives the program voltage $V_{PP1}$, the assist gate line AG receives the program voltage $V_{PP1}$, and the P-well region PW receives the negative voltage $V_{BB1}$. In other words, when the program action is performed, the voltage of the P-well region PW is lower than the voltage of the merged n-doped region 271 connected with the source line SL, and also lower than the voltage of the merged n-doped region 273 connected with the bit line BL. In addition, the time period of performing a single program action is about 50 μs. The magnitude of the program voltage $V_{PP1}$ is about 6 V. The magnitude of the negative voltage $V_{BB1}$ is about −2 V. The P-type semiconductor substrate P_sub and the deep N-well region DNW receive the ground voltage (0 V). Consequently, both of the two diodes $D_1$ and $D_2$ are reverse biased.

While the program action is performed, the select transistor $M_S$ is turned on, and a program current $I_P$ is generated between the bit line BL and the source line SL. When the hot carriers (e.g., electrons) of the program current $I_P$ flow through a channel region corresponding to the floating gate (e.g., the polysilicon gate layer 215), a channel hot electron (CHE) effect is generated. Due to the CHE effect, electrons are injected into the floating gate (e.g., the polysilicon gate layer 215).

Furthermore, since the P-well region PW receives the negative voltage $V_{BB1}$, a channel initiated secondary electron (CHISEL) effect is generated in the floating gate transistor $M_F$. Consequently, more electrons are injected into the floating gate (e.g., the polysilicon gate layer 215). That is, in case that the P-well region PW receives the negative voltage $V_{BB1}$, the program action can be completed efficiently in response to the lower program voltage $V_{PP1}$ and the lower program current $I_P$.

Please refer to FIG. 2C. When the erase action (ERS) is performed, the source line SL receives a negative voltage $V_{BB2}$, the select gate line SG receives the negative voltage $V_{BB2}$, the bit line BL receives the negative voltage $V_{BB2}$, the erase line EL receives the erase voltage $V_{EE1}$, the assist gate line AG receives the negative voltage $V_{BB2}$, and the P-well region PW receives the negative voltage $V_{BB2}$. In addition, the time period of performing a single erase action is about 100 ms. The magnitude of the erase voltage $V_{EE1}$ is about 10 V. The magnitude of the negative voltage $V_{BB2}$ is about −5 V. Similarly, the P-type semiconductor substrate P_sub and the deep N-well region DNW receive the ground voltage (0 V). Consequently, both of the two diodes $D_1$ and $D_2$ are reverse biased.

When the erase action is performed, the select transistor $M_S$ is turned off. Under this circumstance, a Fowler-Nordheim Tunneling (FN) effect is generated in the MOS transistor $C_{MOS}$. Consequently, electrons are ejected from the floating gate (e.g., the polysilicon gate layer 215) to the erase line EL. The negative voltage $V_{BB2}$ received by the assist gate line AG is coupled to the floating gate (e.g., the polysilicon gate layer 215) through the plate capacitor $C_P$, and therefore the negative voltage $V_{BB2}$ is helpful to increase the speed of ejecting the electrons from the floating gate (e.g., the polysilicon gate layer 215). Consequently, the erasing efficiency is enhanced.

Please refer to FIG. 2D. When the read action is performed, the source line SL receives the read voltage $V_R$, the select gate line SG receives the program voltage $V_{PP1}$, the bit line BL receives the ground voltage (0 V), the erase line EL receives the program voltage $V_{PP1}$, the assist gate line AG receives the program voltage $V_{PP1}$, and the P-well region PW receives a negative voltage $V_{BB3}$. For example, the read voltage $V_R$ is about 1.8 V, and the negative voltage $V_{BB3}$ is about −0.5 V. The negative voltage $V_{BB3}$ is greater than the negative voltage $V_{BB1}$, and the negative voltage $V_{BB1}$ is greater than the negative voltage $V_{BB2}$. Similarly, the P-type semiconductor substrate P_sub and the deep N-well region DNW receive the ground voltage (0 V). Consequently, both of the two diodes $D_1$ and $D_2$ are reverse biased. In another embodiment, the source line SL, the select gate line SG, the erase line EL, and the assist gate line AG all receive the read voltage $V_R$, the bit line BL receives the ground voltage (0 V), and the P-well region PW receives the negative voltage $V_{BB3}$.

When the read action is performed, the select transistor $M_S$ is turned on, and the read current $I_R$ is generated between the bit line BL and the source line SL. In other words, the storage state of the memory cell can be determined according to the magnitude of the read current $I_R$. For example, in case that electrons are stored in the floating gate (e.g., the polysilicon gate layer 215), the magnitude of the read current $I_R$ is low (e.g., nearly zero). Consequently, it is determined that the memory cell is in a first storage state. Whereas, in case that no electrons are stored in the floating gate (e.g., the polysilicon gate layer 215), the magnitude of the read current $I_R$ is high. Under this circumstance, it is determined that the memory cell is in a second storage state.

From the above descriptions, the present invention provides an erasable programmable non-volatile memory cell with a novel structure. An isolation area is formed in the P-type semiconductor substrate P_sub. The memory cell is constructed in the isolation area. The control circuit is located outside the isolation area. When the program action (PGM), the erase action (ERS) or the read action (Read) is performed, the memory cell receives a negative voltage. In an embodiment, the memory cell in the isolation area can receive a negative voltage. Since the two diodes $D_1$ and $D_2$ are reverse biased, the bias voltage inside the isolation area (e.g., the deep N-well region DNW) and the bias voltage outside the isolation area (e.g., the deep N-well region DNW) will not be influenced by each other. When the program action, the erase action or the read action is performed, the negative voltage received by the memory cell will not influence the operations of the control circuit outside the isolation area (e.g., the deep N-well region DNW). Due to the negative voltage, the necessary voltage differences for the program action and erase action can be achieved with lower program voltage $V_{PP1}$ and lower erase voltage $V_{EE1}$. Therefore, a small-size charge pump for the non-volatile memory is feasible.

In some embodiments, all non-negative bias voltages (i.e., the voltage greater than or equal to 0 V) are used to perform the program action (PGM). FIG. 3 is a second exemplary bias voltage table illustrating the bias voltages for performing a program action, an erase action and a read action on the memory cell of the present invention. Similarly, both of the two diodes $D_1$ and $D_2$ are reverse biased. In addition, the deep N-well region DNW receive the ground voltage (0 V).

Please refer to FIG. 3. When the program action is performed, the source line SL receives a first voltage $|V_{BB1}|$, the select gate line SG receives the program voltage $V_{PPa}$, the bit line BL receives the program voltage $V_{PPa}$, the erase line EL receives the program voltage $V_{PPa}$, the assist gate line AG receives the program voltage $V_{PPa}$, and the P-well region PW receives the ground voltage (0 V). In addition, the time period of performing a single program action is about 50 μs. The magnitude of the first voltage $|V_{BB1}|$ is the absolute value of the negative voltage $V_{BB1}$, where the negative voltage $V_{BB1}$ is about −2 V. The magnitude of the program voltage $V_{PPa}$ is approximately equal to the program voltage $V_{PP1}$ plus the first voltage $|V_{BB1}|$, where the program voltage $V_{PPa}$ is about +8 V. The negative voltage $V_{BB1}$ and the program voltage $V_{PP1}$ are voltages shown in FIG. 2A.

Please refer to FIG. 3. When the erase action (ERS) is performed, the source line SL receives a negative voltage $V_{BBa}$, the select gate line SG receives the negative voltage $V_{BBa}$, the bit line BL receives the negative voltage $V_{BBa}$, the erase line EL receives the erase voltage $V_{EEa}$, the assist gate line AG receives the negative voltage $V_{BBa}$, and the P-well region PW receives the negative voltage $V_{BBa}$. In addition, the time period of performing a single erase action is about 100 ms. The magnitude of the erase voltage $V_{EEa}$ is about +15 V. The magnitude of the negative voltage $V_{BBa}$ is about −5 V.

Please refer to FIG. 3 again. When the read action is performed, the source line SL receives the read voltage $V_R$, the select gate line SG receives a reference voltage $V_{PPb}$, the bit line BL receives the ground voltage (0 V), the erase line EL receives the reference voltage $V_{PPb}$, the assist gate line AG receives the reference voltage $V_{PPb}$, and the P-well region PW receives a negative voltage $V_{BBb}$. For example, the read voltage $V_R$ is about 1.8 V, the reference voltage $V_{PPb}$ is about 6 V, and the negative voltage $V_{BBb}$ is about −0.5 V. The program voltage $V_{PPa}$ is greater than the reference voltage $V_{PPb}$. The reference voltage $V_{PPb}$ is greater than the read voltage $V_R$. The read voltage $V_R$ is greater than the ground voltage. The ground voltage is greater than the negative voltage $V_{BBb}$. The negative voltage $V_{BBb}$ is greater than the negative voltage $V_{BB1}$, and the negative voltage $V_{BB1}$ is greater than the negative voltage $V_{BBa}$. That is, $|V_{BBa}|$ is greater than $|V_{BB1}|$, and $|V_{BB1}|$ is greater than $|V_{BBb}|$.

The operations of performing the program action, the erase action and the read action according to the bias voltage table of FIG. 3 are respectively similar to those of FIGS. 2B, 2C and 2D, and are not redundantly described herein.

According to the comparison between the bias voltage table of FIG. 2A and the bias voltage table of FIG. 3, the program voltage $V_{PP1}$ is less than the program voltage $V_{PPa}$. When the program action using bias voltages of FIG. 2A is performed, the voltage boosted by the charge pump is lower. Consequently, a small-size charge pump for the non-volatile memory is feasible.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An erasable programmable non-volatile memory cell, comprising:

an isolation structure formed on a P-type semiconductor substrate, wherein a surface of the P-type semiconductor substrate is divided into a first region and a second region by the isolation structure;

a first P-well region formed in the P-type semiconductor substrate and corresponding to the first region;

a second P-well region formed in the P-type semiconductor substrate and corresponding to the second region, wherein the first P-well region and the second P-well region are in contact with each other;

an N-type isolation region, wherein the N-type isolation region is arranged between the first P-well region and the P-type semiconductor substrate to isolate the first P-well region from the P-type semiconductor substrate, the N-type isolation region is arranged between the second P-well region and the P-type semiconductor substrate to isolate the second P-well region from the P-type semiconductor substrate;

a first gate structure and a second gate structure formed on the first region, wherein the first region is divided into a first merged doped region, a second merged doped region and a third merged doped region by the first gate structure and the second gate structure; and a fourth merged doped region formed in the P-type semiconductor substrate and corresponding to the second region, and located beside the second gate structure, wherein the second gate structure is externally extended to the second region through a surface of the isolation structure, and a portion of the second region is covered by the second gate structure, wherein the first merged doped region, the first gate structure and the second merged doped region are collaboratively formed as a select transistor, the second merged doped region, the second gate structure and the third merged doped region are collaboratively formed as a floating gate transistor, and the second gate structure and the fourth merged doped region are collaboratively formed as a MOS capacitor, wherein when a program action is performed, the a voltage of the first P-well region is lower than a voltage of the first merged doped region and a voltage of the third merged doped region.

2. The non-volatile memory cell as claimed in claim 1, wherein the first merged doped region is located beside a first side of the first gate structure, the second merged doped region is arranged between a second side of the first gate structure and a first side of the second gate structure, and the third merged doped region is located beside a second side of the second gate structure.

3. The non-volatile memory cell as claimed in claim 1, wherein the N-type isolation region is a deep N-well region or an N-type buried layer.

4. The non-volatile memory cell as claimed in claim 1, wherein the first merged doped region contains a first ion implantation region and a first lightly doped drain region, the second merged doped region contains a second ion implantation region and a second lightly doped drain region, the third merged doped region contains a third ion implantation region and a third lightly doped drain region, and the fourth merged doped region contains a fourth ion implantation region and a fourth lightly doped drain region.

5. The non-volatile memory cell as claimed in claim 1, further comprising a plate capacitor, wherein a first terminal of the plate capacitor is connected with a floating gate of the floating gate transistor, and a second terminal of the plate capacitor is connected with an assist gate line.

6. The non-volatile memory cell as claimed in claim 5, further comprising a third gate structure, wherein the third gate structure is formed on the isolation structure and located beside a first side of the second gate structure, wherein the plate capacitor comprises a first poly/poly plate capacitor, and the third gate structure and the second gate structure are collaboratively formed as the first poly/poly plate capacitor.

7. The non-volatile memory cell as claimed in claim 6, further comprising a fourth gate structure, wherein the fourth gate structure is formed on the isolation structure and located beside a second side of the second gate structure, wherein the plate capacitor further comprises a second poly/poly plate capacitor, and the fourth gate structure and the second gate structure are collaboratively formed as the second poly/poly plate capacitor, and the second poly/poly plate capacitor and the first poly/poly plate capacitor are connected with each other in parallel.

8. The non-volatile memory cell as claimed in claim 5, further comprising a metal layer, wherein the metal layer is formed over the second gate structure, wherein the plate capacitor further comprises a metal/poly plate capacitor, and the metal layer and the second gate structure are collaboratively formed as the metal/poly plate capacitor.

9. The non-volatile memory cell as claimed in claim 5, wherein the first gate structure is connected with a select gate line, the first merged doped region is connected with a source line, the third merged doped region is connected with a bit line, and the fourth merged doped region is connected with an erase line.

10. The non-volatile memory cell as claimed in claim 9, wherein when a program action, an erase action or a read action is performed, a junction between the first P-well region and the N-type isolation region is reverse biased, and a junction between the P-type semiconductor substrate and the N-type isolation region is reverse biased.

11. The non-volatile memory cell as claimed in claim 10, wherein when the program action is performed, the source line receives a ground voltage, the select gate line receives a program voltage, the bit line receives the program voltage, the erase line receives the program voltage, the assist gate line receives the program voltage, and the first P-well region receives a first negative voltage, wherein the program voltage is greater than the ground voltage, and the ground voltage is greater than the first negative voltage.

12. The non-volatile memory cell as claimed in claim 11, wherein when the erase action is performed, the source line receives a second negative voltage, the select gate line receives the second negative voltage, the bit line receives the second negative voltage, the erase line receives an erase voltage, the assist gate line receives the second negative voltage, and the first P-type well region receives the second negative voltage, wherein the erase voltage is greater than the ground voltage, and the first negative voltage is greater than the second negative voltage.

13. The non-volatile memory cell as claimed in claim 12, wherein when the read action is performed, the source line receives a read voltage, the select gate line receives the program voltage, the bit line receives the ground voltage, the erase line receives the program voltage, the assist gate line receives the program voltage, and the first P-well region receives a third negative voltage, wherein the program voltage is greater than the read voltage, the read voltage is greater than the ground voltage, the ground voltage is greater than the third negative voltage, and the third negative voltage is greater than the first negative voltage.

14. The non-volatile memory cell as claimed in claim 12, wherein when the read action is performed, the source line, the select gate line, the erase line, and the assist gate line all receive a read voltage, the bit line receives the ground voltage, and the first P-well region receives a third negative voltage, wherein the read voltage is greater than the third negative voltage, and the third negative voltage is greater than the first negative voltage.

15. The non-volatile memory cell as claimed in claim 10, wherein when the program action is performed, the source line receives a positive voltage, the select gate line receives a program voltage, the bit line receives the program voltage, the erase line receives the program voltage, the assist gate line receives the program voltage, and the first P-well region receives a ground voltage, wherein the program voltage is greater than the positive voltage, and the positive voltage is greater than the ground voltage.

16. The non-volatile memory cell as claimed in claim 15, wherein when the erase action is performed, the source line receives a first negative voltage, the select gate line receives the first negative voltage, the bit line receives the first negative voltage, the erase line receives an erase voltage, the assist gate line receives the first negative voltage, and the first P-type well region receives the first negative voltage, wherein the erase voltage is greater than the ground voltage, the ground voltage is greater than the first negative voltage, and an absolute value of the first negative voltage is greater than the positive voltage.

17. The non-volatile memory cell as claimed in claim 16, wherein when the read action is performed, the source line receives a read voltage, the select gate line receives a reference voltage, the bit line receives the ground voltage, the erase line receives the reference voltage, the assist gate line receives the reference voltage, and the first P-well region receives a second negative voltage, wherein the program voltage is greater than the reference voltage, the reference voltage is greater than the read voltage, the read voltage is greater than the ground voltage, the ground voltage is greater than the second negative voltage, and the positive voltage is greater than an absolute value of the second negative voltage.

18. The non-volatile memory cell as claimed in claim 1, wherein the second gate structure extends across the second region, and the second region is divided into the fourth merged doped region and a fifth merged doped region by the second gate structure.

* * * * *